US006467075B1

(12) United States Patent
Sato et al.

(10) Patent No.: US 6,467,075 B1
(45) Date of Patent: Oct. 15, 2002

(54) RESOLUTION OF DYNAMIC MEMORY ALLOCATION/DEALLOCATION AND POINTERS

(75) Inventors: Koichi Sato, Tokyo (JP); Lcu Semeria; Giovanni De Micheli, both of Stanford, CA (US)

(73) Assignees: NEC Corporation, Tokyo (JP); The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 09/533,808

(22) Filed: Mar. 24, 2000

(51) Int. Cl.[7] ............................................... G06F 17/50
(52) U.S. Cl. .............................. 716/18; 716/17; 716/19; 716/3; 716/5; 716/6
(58) Field of Search ........................... 716/18, 17, 1–6, 716/19

(56) References Cited

U.S. PATENT DOCUMENTS

| | | | | |
|---|---|---|---|---|
| 5,703,789 A | * | 12/1997 | Beausang et al. | 364/489 |
| 5,764,951 A | * | 6/1998 | Ly et al. | 395/500 |
| 5,903,466 A | * | 5/1999 | Beausang et al. | 364/488 |
| 5,930,827 A | * | 7/1999 | Sturges | 711/170 |
| 6,263,302 B1 | * | 1/2000 | Hellestrand et al. | 703/17 |
| 6,021,132 A | * | 2/2000 | Muller et al. | 370/412 |
| 6,295,594 B1 | * | 2/2000 | Meier | 711/171 |
| 6,044,418 A | * | 3/2000 | Muller | 710/56 |
| 6,067,608 A | * | 5/2000 | Perry | 711/203 |
| 6,076,151 A | * | 6/2000 | Meier | 711/171 |
| 6,253,226 B1 | * | 6/2001 | Chidambaran et al. | 709/104 |
| 6,308,319 B1 | * | 10/2001 | Bush et al. | 717/5 |

* cited by examiner

Primary Examiner—Vuthe Siek
Assistant Examiner—Granvill D Lee, Jr.
(74) Attorney, Agent, or Firm—Sughrue Mion, PLLC

(57) ABSTRACT

One of the greatest challenges in C/C++-based design methodology is to efficiently map C/C++ models into hardware. Many of the networking and multimedia applications implemented in hardware or mixed hardware/software systems are making use of complex data structures stored in one or multiple memories. As a result, many of the C/C++ features which were originally designed for software applications are now making their way into hardware. Such features include dynamic memory allocation/deallocation and pointers used to manage data. This inventors present a solution for efficiently mapping arbitrary C code with pointers and malloc/free into hardware. This solution fits current memory management methodologies. It consists of instantiating a hardware allocator tailored to an application and a memory architecture. This work also supports the resolution of pointers without restriction on the data structures. An implementation using the SUIF framework is presented, followed by some case studies such as the realization of a video filter.

24 Claims, 8 Drawing Sheets

ENCODING OF POINTERS IN AN ARRAY

C+ MEMORY BINDING
(FUNCTION DESCRIPTION)

RESOLUTION OF DYNAMIC MEMORY ALLCATION AND POINTERS
FOR HARDWARE SYNTHESIS FROM C

REPRESENTATION OF struct { int a; int b; } s[];

ENCODING OF POINTERS IN AN ARRAY

IMPLEMENTATION OF *(q+1) = *p+1

ARCHITECTURE FOR MULTIPLE MEMORY AND ALLOCATOR

C+ MEMORY BINDING
(FUNCTION DESCRIPTION)

RESOLUTION OF DYNAMIC MEMORY ALLCATION AND POINTERS
FOR HARDWARE SYNTHESIS FROM C

FIG. 9

| test | malloc /free | C lines | optimization | HDL lines | total latency | size(1000x) | | CPU time (in s) |
|---|---|---|---|---|---|---|---|---|
| | | | | | | comb. | non-c. | |
| test 1 | 3 / 2 | 72 | gen. alloc. (no sharing) | 344 | 713 | 568 | 269 | 14.8 |
| | | | gen. alloc. | 315 | 735 | 391 | 180 | 13.8 |
| | | | gen. alloc. (optimized) | 323 | 617 | 405 | 199 | 14.4 |
| | | | sequence | 167 | 32 | 135 | 87 | 14.3 |
| test 2 | 3 / 2 | 66 | gen. alloc. (no sharing) | 339 | 1,425 | 551 | 271 | 13.8 |
| | | | gen. alloc. | 310 | 1,732 | 338 | 177 | 13.4 |
| | | | gen. alloc. (optimized) | 318 | 1,221 | 372 | 177 | 13.2 |
| | | | spec.alloc. | 294 | 781 | 190 | 109 | 12.9 |
| | | | sequence | 173 | 298 | 159 | 86 | 13.9 |
| test 2 | 4 / 4 | 190 | gen. alloc. (no sharing) | 659 | 438 | 1,287 | 747 | 21.7 |
| | | | gen. alloc. | 630 | 465 | 1,023 | 632 | 20.6 |
| | | | gen. alloc. (optimized) | 640 | 403 | 1,025 | 637 | 20.6 |

TABLE 3:
RESULTS FOR THE DIFFERENT EXAMPLES AND OPTIMIZATIONS
( SIZE IN LIBRARY UNITS USING THE TSMC.35 TARGET
LIBRARY; FREQUENCY 100MHz FOR TEST 1 AND TEST 2,
50MHz FOR JPEG; CPU TIME MEASURED ON SUN ULTRA2
DOES NOT INCLUDE HIGH LEVEL SYNTHESIS)

INTERFACE OF THE ALLOCATOR BLOCK IMPLEMENTING
malloc AND free FUNCTIONS

RESOLUTION OF DYNAMIC MEMORY ALLOCATION/DEALLOCATION AND POINTERS

BACKGROUNDS OF THE INVENTION

1. Field of the Invention

The present invention relates to a device of synthesizing a program with a function of pointers and dynamic allocation/deallocation, and a method of synthesizing a program with a function of pointers and dynamic allocation/deallocation.

2. Description of the Related Art

Different languages have been used as input to high-level synthesis. Hardware Description Languages (HDLs), such as Verilog HDL and VHDL, are the most commonly used. However, designers often write system-level models using programming languages, such as C or C++, to estimate the system performance and verify the functional correctness of the design. Using C/C++ offers higher-level of abstraction, fast simulation as well as the possibility of leveraging a vast amount of legacy code and libraries, which facilitates the task of system modeling.

The use of C/C++ or a subset of C/C++ to describe both hardware and software would accelerate the design process and facilitate the software/hardware migration. Designers could describe their system using C. The system would then be partitioned into software and hardware blocks, implemented using synthesis tools. The new SystemC initative is an attempt to standardize a C/C++-based language for both hardware and software design.

C was originally designed to develop the UNIX operating system. It provides constructs to directly access memory (through pointers) and to manage memories and I/O using the standard C library (malloc, free, . . . ). These constructs are widely used in software. Nevertheless, many of the networking and multimedia applications implemented in hardware or mixed hardware/software systems are also using complex data structures stored in one or multiple memory banks. As a result, many of the C/C++ features which were originally designed for software applications are now making their way into hardware.

In order to help designers refine their code from a simulation model to a synthesizable behavioral description, this inventors are trying to efficiently synthesize the full ANSI C standard. This task turns out to be particularly difficult because of dynamic memory allocation/deallocation, function calls, recursions, goto's, type castings and pointers.

In the past few month, different synthesis tools have been announced to ease the mapping of C code into hardware (Abhijit Ghosh, Joachim Kunkel, Stan Liao, "Hardware Synthesis from C/C++," proceedings of the Design, Automation and Test in Europe DATE'99, pp.387–389, Munich, 1999.), (Kazutoshi Wakabayashi, "C-based Synthesis with Behavioral Synthesizer, Cyber," proceedings of the Design, Automation and Test in Europe DATE'99, pp.390–391, Munich, 1999.). And other many more companies and research projects work on synthesis of hardware from C. All of these tools support a subset of the language (e.g. restrictions on pointers, function calls, etc.). In particular, they do not support dynamic memory allocation/deallocation using the ANSI standard library functions malloc and free In this inventors tool SpC (Luc Semeria, Giovanni De Micheli, "SpC: Synthesis of Pointers in C.Application of Pointer Analysis to the Behavioral Synthesis from C", proceedings of the International Conference on Computer-Aided Design ICCAD'98, pp.321–326, San Jose, November 98.), pointer variables are resolved at compile-time to synthesize c functional models in hardware efficiently. In description of the preferred embodiment, this inventors will focus on an implementation of dynamic memory allocation/deallocation (malloc, free) in hardware. By definition, in general, storage for dynamically allocated data structures cannot be assigned at compile time. The synthesis of C code involving dynamic memory allocation/deallocation requires access to some allocation and deallocation primitives implemented either in software, as in an operating system, or in hardware.

Dynamic memory allocation/deallocation is tightly coupled with pointers and the notion of a single address space. Pointer dereferences (load, stores, etc.) as well as memory allocation/deallocation are all referring to a main memory. However, in application-specific hardware, designers may want to optimize the memory architecture by using register banks, multiple memories etc. Therefore, memory allocations may be distributed onto multiple memories and pointers may reference data stored in registers, memories or even wires (e.g. output of a functional unit). To enable efficient mapping of C code with pointers and malloc's into hardware, the synthesis tool has to automatically generate the appropriate circuit to dynamically allocate, access (read/write) and deallocate data. Memory management as well as accurate pointers resolution are key features for C-based synthesis. They are enablers for the efficient design of applications involving complex data structures.

The contribution of description of the preferred embodiment is to present a solution for efficiently mapping arbitrary program code with pointers and dynamic allocation allocation/deallocation into hardware. This solution fits current memory management methodologies. It consists of instantiating a hardware allocator tailored to an application and a memory architecture. This work also supports the resolution and optimization of pointers without restriction on the data structures.

METHODOLOGY AND RELATED WORK

For decades, memory management has been one of the major development area both for software and computer architecture. In software, at the user-level, memory management is typically performed by the operating system. In hardware, memory bandwidth is often a bottleneck in applications such as networking, signal processing, graphics and encryption. Memory architecture exploration and efficient memory management technology are key to the design of new high-performance systems. Memory generators commercially available today enable fast integration of memories in a system. Scheduling of memory accesses has also been integrated into most commercial high level synthesis (ELS) tools. Most of the refinement and compilations steps developed for software applications can also be used for hardware. Nevertheless, a software methodology usually assumes a fixed memory architecture which may be general purpose or application specific like in a DSP or ASIP. In hardware, at the behavioral level, designers would typically explore different memory architectures in order to trade-off area and power for a given timing constraint.

A few projects and tools have recently been announced to ease the mapping of C models into hardware. In practice, current tools don't support dynamic memory allocation/deallocation and have restriction on pointers' usage (Giovanni De Micheli , "Hardware Synthesis from c/c++," in the proceeding of the Design, Automation and Test in Europe DATE'99, pp.382–383, Munich, 1999.). SpC , enables the behavioral synthesis of C code with pointer variables to variables and arrays. In description of the preferred embodiment, this inventors present how pointers in general (e.g. array of pointers, pointers in structures, pointers to structures etc.) and dynamic memory allocation/deallocation can also be efficiently synthesized.

A methodology for the design of custom memory systems has been described by Catthoor et al. (Francky Catthoor, Sven Wuytack, Eddy De Greef, Florin Balasa, Lode Nachtergaele, Arnout Vandecappelle, "Custom Memory Management Methodology," Kluwer Academic Publishers, Dordrecht, June 98.). It is defined for two sets of applications, networking and signal processing, and supports a limited subset of C/C++. The basic concepts presented in Catthoor's work can be generalized to support a larger subset of the C syntax for an extended set of applications. Two main steps can be distinguished in the methodology: this inventors describe briefly here the transformations performed first at the system level, and then at the architectural level.

At the system level, the functionality of the algorithm is verified. Data formats are refined. For example, after quantization, the format of data can be refined from floating-point to fixed-point (H. Keding, M. Willems, M. Coors, H. Meyr, "FRIDGE: A Fixed-Point Design And Simulation Environment," proceedings of the Design Automation and Test in Europe DATE'98, pp.429–435, 1998.). Data structures can also be refined for example to reduce the number of indirect memory references. Examples of such transformations for networking applications have been studied by Wuytack et al. in (Sven Wuytack, Julio da Silva Jr., Francky Catthoor, Gjalt de Jong, Chantal Ykman, "Merrory Management for Embedded Network Applications," transactions on Computer Aided Design, Volume 18, number 5, pp. 533–544, May 99.), (Sven Wuytack, Francky Catthoor, Hugo De Man, "Transforming set data types to power optimal data structures," IEEE Transactions on Computer Aided Design, pp.619–629, June 1996.).

At the architectural level, after partitioning, the system typically consists of multiple communicating processes to be mapped to hardware or software (Abhijit Ghosh, Joachim Kunkel, Stan Liao, "Hardware Synthesis from C/C++," proceedings of the Design, Automation and Test in Europe DATE'99, pp.387–389, Munich, 1999.). Memory segments are defined for internal storage and/or shared memory. These memory segments can then be mapped to one or multiple memories during synthesis. Some of the storage area (e.g. internal variables, etc.) can be statically allocated during synthesis or compilation. However, to support dynamic storage allocation/deallocation (e.g. for recursive data structures), allocation and deallocation primitives implemented in software or hardware shall be defined.

In software, memory allocation and deallocation are implemented as primitives part of the operating system (OS). These primitives can be called in a C program using the functions defined in the standard library (e.g. malloc, free, etc.) Many schemes have been developed for OS to manage memory. An extensive survey of the techniques used for memory allocation and deallocation can be found in (Paul Wilson, Mark Johnstone, David Doles, "Dynamic Storage Allocation: A Survey and Critical Review," presented at Int. Workshop Memory Management, Kinross, Scotland, September 95.).

Memory management can also be implemented in hardware. For memory allocation and deallocation, instead of the system calls to the OS, requests are sent through signals to an allocator block (AKA. virtual memory manager) implemented in hardware. Its interface is shown on FIG. 10. Internally, the allocator stores a list of the free blocks in memory as well as a list of the allocated blocks. To allocate memory, the size of the block to be allocated (malloc_size) is sent. The allocator then searches in its free list a big enough block and returns the address of the beginning of this block (malloc_address). Two techniques are often used: first fit where the first acceptable free block is returned or best fit where the block of minimal size is returned. To free previously allocated memory, the address of the block to be deallocated (free_address) is sent to the allocator. The allocator then searches inside of the allocated list the block and adds it back to the free list. Adjacent free blocks can then be merged. The implementation itself of the allocator can vary according to the application and the data structures. A number of these implementations are presented by Wuytack et al. (Sven wuytack, Jullio da Silva Jr., Francky Catthoor, Gjalt de Jong, Chantal Ykman, "Memory Management for Embedded Network Applications," transactions, on Computer Aided Design, Volume 18, number 95, pp. 533–544, May 99.), (J. Morris Chang, Edward R. Gehringer "A High-Performance Memory Allocator for Object-Oriented Systems," IEEE trans. on Computers, vol. 45, no. 3, march 96.).

FIG. 10 is a diagram for explaining the interface of the allocator block implementing malloc and free functions.

Once an architecture is decided, hardware can be implemented using synthesis tools and compilers can be used for software. As far as memory management is concerned, memory accesses scheduling, register/memory allocation and address generation can be integrated into synthesis tools and compilers. The latest development for hardware synthesis have been presented by Catthoor et al (Francky Catthoor, Sven Wuytack, Eddy De Greef, Florin Balasa, Lode Nachtergaele, Arnout Vandecappelle, "Custom Memory Management Methodology," Kluwer Academic Publishers, Dordrecht, June 98.) and Panda et al. (Preeti Ranjan Panda, Nikil D.Dutt, Alexandru Nicolau, "Memory Issues in Embedded Systems-On-Chip Optimizations and Exploration," Kluwer Academic Pub, October 1998.).

This contribution fits in the methodology described above. In particular, this inventors present techniques to automate the synthesis of program code with pointers and dynamic memory allocation/deallocation into hardware. The outcome of this research is a tool that maps and optimizes hardware models in program code with pointers and dynamic memory allocation/deallocation into verilog HDL synthesizable by commercially available synthesis tools.

SUMMARY OF THE INVENTION

It is an object of the present invention to provide the circuit synthesis method of synthesizing the semiconductor circuit of executing the program containing pointer and dynamic allocation/deallocation.

According to the first aspect of the invention, a circuit synthesis method of a semiconductor circuit for executing a program with a function of pointers and dynamic allocation, comprising the steps of:

resolving pointer and dynamic allocation in the code of the program; and changing the code of the program into the code which does not contain the pointer and the dynamic allocation;

wherein synthesizing the semiconductor circuit which executes the program with a function of pointers and dynamic allocation.

In the preferred construction, the program is C-language program.

In another preferred construction, the circuit synthesis method further comprising a step of changing the code changed by the resolution step into the code of Hardware Description Languages, and a step of synthesizing the semiconductor circuit based on the code of Hardware Description Languages.

In another preferred construction, the resolution step including a step of checking the kind of the variable which is the object of dynamic allocation and the quantity of a memory assigned in the code, a step of performing beforehand variable declaration of the variable which is the object of the dynamic allocation statically in the converted code, a step of replacing the command which performs dynamic allocation in the code with the command which gives the pointer to the variable by which variable declaration was carried out.

According to the second aspect of the invention, a circuit synthesis method of a semiconductor circuit for executing a program with a function of pointers and dynamic allocation, comprising the steps of:

resolving pointer and dynamic allocation in the code of the program; and changing the code of the program into the code which does not contain the pointer and the dynamic allocation; and the resolution step including a step of checking the kind of the variable which is the object of dynamic allocation and the quantity of a memory assigned in the code, a step of performing beforehand variable declaration of the variable which is the object of the dynamic allocation statically in the converted code, a step of replacing the command which performs dynamic allocation in the code with the command which gives the pointer to the variable by which variable declaration was carried out, wherein synthesizing the semiconductor circuit which executes the program with a function of pointers and dynamic allocation.

According to the third aspect of the invention, a circuit synthesis method of a semiconductor circuit for executing a program with a function of pointers and dynamic allocation, comprising the steps of:

resolving pointer and dynamic allocation in the code of the program; and changing the code of the program into the code which does not contain the pointer and the dynamic allocation; and the resolution step including a pointer analysis step of finding pointer variable in the code, and checking the information on the variable which substitutes an address to each pointer variable, a step of executing variable declaration of a structure object comprising a variable tag and a integer variable index in the code after the conversion corresponding to each pointer variable, which variable tag shows the kind of variable substituted to a pointer variable, and which integer variable index records the addition-and-subtraction processing in the code to the pointer variable, a step of replacing the command which substitutes the address of other variables to the pointer variable in the code with the command which substitutes the information on the kind of other variables to the variable tag and substitutes value "0" to the variable index, a step of replacing the command which fluctuates the value of the pointer variable in the code with the command which fluctuates the value of the variable index of the structure object corresponding to the pointer variable, a step of replacing the command which refers to the address shown by the pointer variable with the command which refers to the value of the arrangement position of the value of the variable index in the variable shown by the variable tag, a step of checking the kind of the variable which is the object of dynamic allocation and the quantity of a memory assigned in the code, a step of performing beforehand variable declaration of the variable which is the object of the dynamic allocation statically in the converted code, a step of replacing the command which performs dynamic allocation in the code with the command which gives the pointer to the variable by which variable declaration was carried out, wherein synthesizing the semiconductor circuit which executes the program with a function of pointers and dynamic allocation.

In another preferred construction, the circuit synthesis method further comprising recording the number of block allocated to block of the pointer variable, accessing the block by specifying the number of block in free area by allocator, wherein synthesizing the semiconductor circuit which executes management of optimized free area.

In another preferred construction, the resolution step including when the size of the variable to be allocated has to be constant, and dynamically-allocated variable have to be both allocated and deallocated within the same unbounded loop, a step of performing beforehand statically variable declaration of the array variable which is the same size as the dynamically-allocated variable in the converted code, a step of replacing the command which performs dynamic allocation with the command which references the variable to the array variable by which variable declaration was carried out, a step of removing the command performs dynamic deallocation in the code.

According to another aspect of the invention, a circuit synthesis system of a semiconductor circuit for executing a program with a function of pointers and dynamic allocation, comprising:

a means for resolving pointer and dynamic allocation in the code of the program; and a means for changing the code of the program into the code which does not contain the pointer and the dynamic allocation;

wherein synthesizing the semiconductor circuit which executes the program with a function of pointers and dynamic allocation In another preferred construction, the program is C-language program.

In another preferred construction, the circuit synthesis system further comprising a means for changing the code changed by the resolution meaning into the code of Hardware Description Languages, and a means for of synthesizing the semiconductor circuit based on the code of Hardware Description Languages.

In another preferred construction, the resolution meaning including a means for checking the kind of the variable which is the object of dynamic allocation and the quantity of a memory assigned in the code, a means for performing beforehand variable declaration of the variable which is the object of the dynamic allocation statically in the converted code, a means for replacing the command which performs dynamic allocation in the code with the command which gives the pointer to the variable by which variable declaration was carried out.

According to another aspect of the invention, a circuit synthesis system of a semiconductor circuit for executing a program with a function of pointers and dynamic allocation, comprising:

a means for resolving pointer and dynamic allocation in the code of the program; and a means for changing the code of the program into the code which does not contain the pointer and the dynamic allocation; and the resolution meaning including a means for checking the kind of the variable which is the object of dynamic allocation and the quantity of a memory assigned in the code, a means for performing beforehand variable declaration of the variable which is the object of the dynamic allocation statically in the converted code, a means for replacing the command which performs dynamic allocation in the code with the command which gives the pointer to the variable by which variable declaration was carried out, wherein synthesizing the semiconductor circuit which executes the program with a function of pointers and dynamic allocation.

According to another aspect of the invention, a circuit synthesis system of a semiconductor circuit for executing a program with a function of pointers and dynamic allocation, comprising:

a means for resolving pointer and dynamic allocation in the code of the program; and a means for changing the code of the program into the code which does not contain the pointer and the dynamic allocation; and the resolution meaning including a pointer analysis means for finding pointer variable in the code, and checking the information on the variable which substitutes an address to each pointer variable, a means for executing variable declaration of a structure object comprising a variable tag and a integer variable index in the code after the conversion corresponding to each pointer variable, which variable tag shows the kind of variable substituted to a pointer variable, and which integer variable index records the addition-and-subtraction processing in the code to the pointer variable, a means for replacing the command which substitutes the. address of other variables to the pointer variable in the code with the command which substitutes the information on the kind of other variables to the variable tag and substitutes value "0" to the variable index, a means for replacing the command which fluctuates the value of the pointer variable in the code with the command which fluctuates the value of the variable index of the structure object corresponding to the pointer variable, a means for replacing the command which refers to the address shown by the pointer variable with the command which refers to the value of the arrangement position of the value of the variable index in the variable shown by the variable tag, a means for checking the kind of the variable which is the object of dynamic allocation and the quantity of a memory assigned in the code, a means for performing beforehand variable declaration of the variable which is the object of the dynamic allocation statically in the converted code, a means for replacing the command which performs dynamic allocation in the code with the command which gives the pointer to the variable by which variable declaration was carried out, wherein synthesizing the semiconductor circuit which executes the program with a function of pointers and dynamic allocation.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings:

FIG. 9 is a diagram showing a table of result for the different examples and optimizations;

DESCRIPTION OF THE PREFERRED EMBODIMENT

Figure 1:
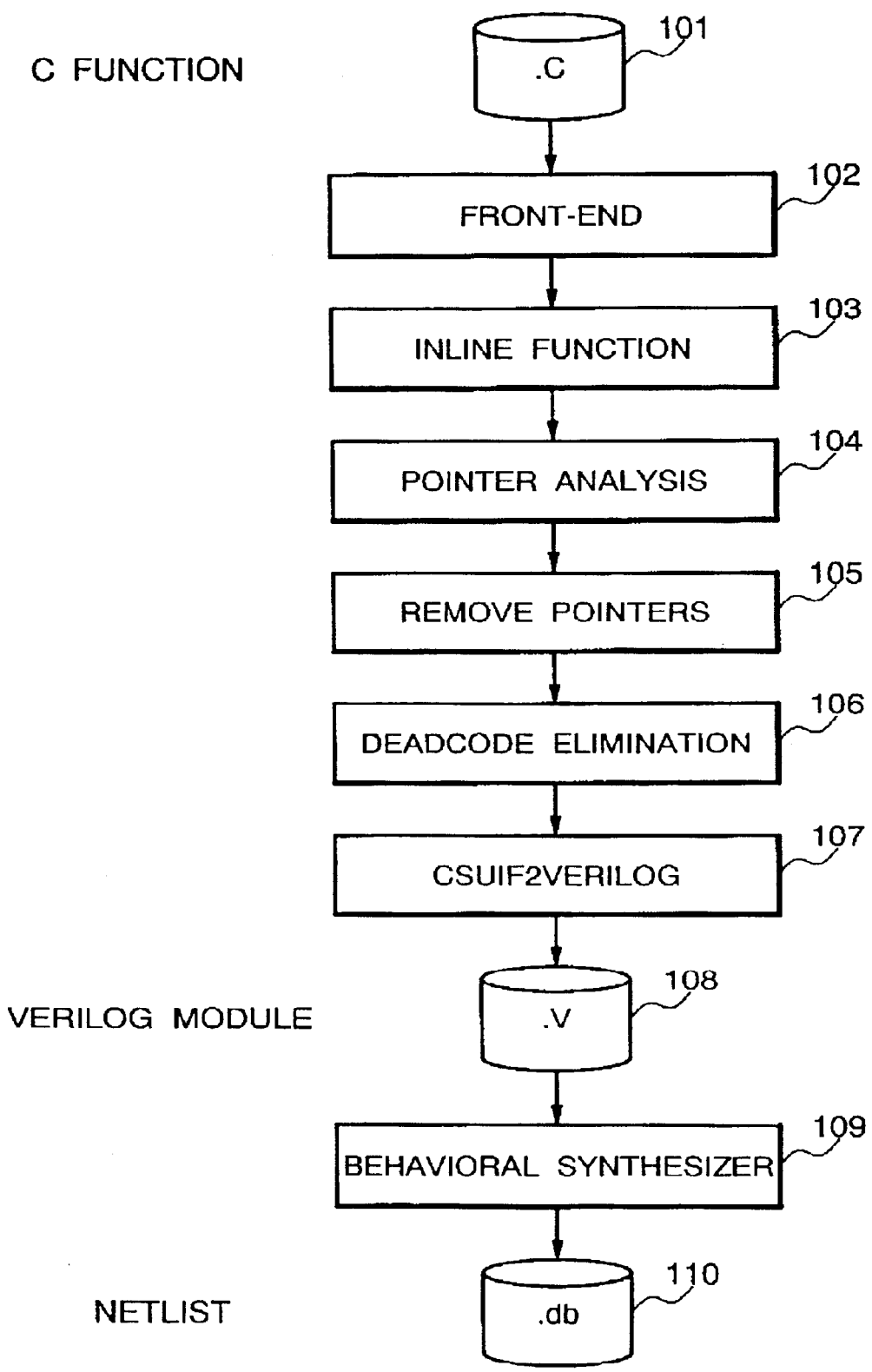
FIG. 1 is a flow chart showing synthesis operation of the synthesizing system according to one embodiment of the present embodiment.

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

In software, the semantics of pointers is the address of an element in memory. This definition implies that the C program is targeted to a virtual architecture consisting of one memory in which everything is stored. Even though register declaration may allow programmers to specify the variables to place in registers, the assignment of variables to registers is generally done by the compiler. The notions of caches and memory pages are transparent to programmers.

In hardware, at the behavioral level, designers want to have control on where data are stored and want to optimize the locality of the storage. Typically, a chip design contains multiple memory banks, register files, registers and wires. Pointers may be used to reference any variable no matter where its information is available. Pointers must be considered as references: references to memory elements, registers, wires or ports. In particular, pointers can be used to allocate, read, write and deallocate data. In this description of the preferred embodiment this inventors call the action of reading data using a pointer a load. Subsequently, a store is the action of writing data using a pointer. Allocation and deallocation are performed through the standard library functions malloc and free. Their implementation is however tailored for a given application and memory architecture.

The synthesis of pointers in general consists of generating the appropriate circuit for allocating and accessing data. For this purpose, this inventors change the addresses into numbers (i.e. encode pointers values) and replace loads and stores by some assignments directly accessing the data the pointer may reference (i.e. resolve pointers). Functions malloc and free are subsequently changed as memory allocation/deallocation can be distributed onto multiple memories.

EXAMPLE 1

Consider an application, where a hardware block receives objects of different sizes and processes them. Some of these objects are copied in a register (reg) Some other are only used within this block and are stored in private memory (local_RAM). Finally some, larger, may also to be accessed by other blocks and are stored in a shared memory (shared_RAM).

. . .
   if(object.is_reg) p=&req;
   if(object.is_internal) //allocate memory in local_RAM
     p=malloc(4);
   else //allocate memory in shared_RAM p=malloc(8);
. . .
   //store in reg, local_RAM or shared_RAM
   *p=object.data;
. . .
   if(!object.is_reg) //free storage in local_RAM or in
     shared_RAM free(p);

In order to implement the store (*p=object.data), the tool has to schedule a write operation into the register reg, the memory local_RAM or the memory shared_RAM. It also needs to instantiate the correct circuit (steering logic) to access these locations. For this purpose, this inventors need to know at compile-time the set of locations the pointer p may point to (points-to set).

To implement free(p), assuming that each memory local_RAM and shared_RAM is managed by a specific allocator, the tool also needs to schedule a deallocation operation on one allocator or the other. The points-to information for the pointer p is also necessary.

As this inventors can see in Example 1, in order to map loads, stores as and free operations into hardware, this inventors need to know at compile-time the set of locations the pointers may reference (points-to information).

Such information is also widely used in compilers. In order to parallelize programs onto distributed architectures, the independent sets of data which can be processed in parallel have to be extracted. The problem there is to find statements in the program that may read or write the same locations (aliasing problem). For this purpose, the aliasing information has to be determined between pointers. The points-to information and the aliasing information are equivalent and can be determined by recent analysis techniques called pointer-analysis or alias-analysis.

FIG. 1 is a flow chart showing synthesis operation of the synthesizing system according to one embodiment of the present embodiment.

Figure 2:
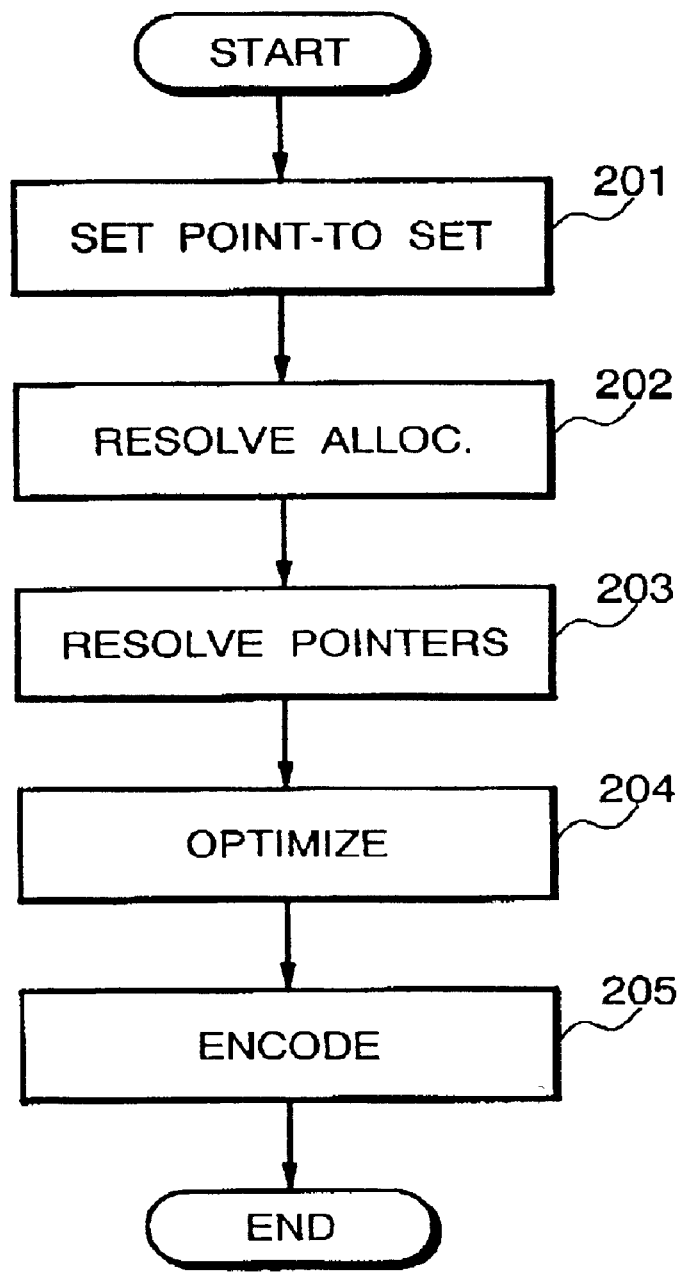
FIG. 2 is a flow chart showing remove pointers operation of the synthesizing system according to one embodiment of the present embodiment.

FIG. 2 is a flow chart showing remove pointers operation of the synthesizing system according to one embodiment of the present embodiment.

Pointer Analysis

Pointer analysis is a compiler technique to identify at compile-time the potential values of the pointers in the program. This information is used to determine the set of locations the pointer may point to. For synthesis, in the case of loads, stores, and free, this inventors want to synthesize the logic to access, modify or deallocate the location referenced by the pointer. For this purpose, the points-to information must be both safe and accurate: safe because this inventors have to consider all of the locations the pointer may reference and accurate because the smaller the points-to set is, the less logic this inventors have to generate.

Two main types of analyses can be distinguished. First flow- and context-insensitive analyses (Djarne Steensgaard "Point-to Analysis by Type Inference of Programs with Structures and Unions", proceedings of the 1996 International Conference on Compiler Construction, pp.136–150, April 96.) don't distinguish the order in which the statements are executed (flow-insensitivity) and the different calls of a function (context-insensitivity). They are the least accurate but the relative simplicity of their implementation makes them more suitable for very large programs. Flow- and context-sensitive analyses, such as by Wilson and Lam (Robert Wilson, "Efficient, Context-Sensitive Pointer Analysis For C Programs", Ph.D. Dissertation, Stanford University, 1997., Robert Wilson, Monica Lam, "Efficient Context-Sensitive Pointer Analysis for C Programs", proceedings of the ACM SIGPLAN'95 Conference on Programming Languages Design and Implementation, pp.1–12, June 95 ), on the other hand, provide more accuracy with an increased complexity.

Even though the complexity of flow- and context-sensitive analyses may be exponential, it is not a limitation for hardware synthesis because this inventors deal with rather small and simple programs with limited calling contexts for functions and often no recursions. Beside these analyses leads to more accurate results, which makes them more suitable for hardware synthesis. Most of the inaccuracy comes from the way memory in represented. Different techniques have been used to identify the different locations in memory.

Memory Representation

The simplest memory representation consists of a single address space in which all data are stored. This trivial representation however prevents from optimizing the locality and parallelizing the code. On the other hand, the most accurate representation, which would distinguish each element of arrays or of recursive data structures, is not practical. As a result, most analysis techniques combine elements within a single data structure. Some techniques combine elements based on their allocation contexts (Robert Wilson, "Efficient, Context-Sensitive Pointer Analysis For C Programs", Ph.D. Dissertation, Stanford University, 1997., Robert Wilson, Monica Lam, "Efficient Context-Sensitive Pointer Analysis for C Programs", proceedings of the ACM SIGPLAN'95 Conference on Programming Languages Design and Implementation, pp.1–12, June 95.) or on limiting the length of access paths to some fixed constant (k-limiting). Shape analysis (Alain Deutsh, "Interprocedural may-alias analysis for pointers: Beyond k-limiting," proceedings of the ACM SIGPLAN'94 Conference on Programming Language Design and Implementation, pp. 230–241, June 94., Rakesh Ghiya and Laurie Hendren, "Is it a tree, a DAG, or a cyclic graph? A shape analysis for heap-directed pointers in C," proceedings of the 23th Annual ACM Symposium on Principle of Programming Languages.) gives the most accurate representation as they may distinguish trees from DAGs, linear lists from cyclic lists and so on. However its implementation to support large C programs remains challenging.

In order to find both an accurate and practical representation for hardware synthesis, this inventors propose to use the notion of location sets defined in (Robert Wilson, "Efficient, Context-Sensitive Pointer Analysis For C Programs", Ph.D. Dissertation, Stanford University, 1997., Robert Wilson, Monica Lam, "Efficient Context-Sensitive Pointer Analysis for C Programs", proceedings of the ACM SIGPLAN'95 Conference on Programming Languages Design and Implementation, pp.1–12, June 95.). Locations sets support any of the data structures available in C including arrays, structures, arrays of structures and structures containing arrays. This representation is also relatively simple as it combines the different elements of an array or of recursive data structures. It can therefore be used for large C programs.

A location set $<f,s> \in N \times Z$ (N:natural number, Z:integer) represents the set of locations with offsets $\{f+is: i \in Z\}$ in a particular block of memory That is, f is an offset within a block and s is the stride. If the stride is zero, the location set contains a single element. Otherwise, it is assumed to be an unbounded set of locations. Table 1 shows the location sets for various expressions.

TABLE 1

LOCATION SET EXAMPLES (F = OFFSET OF FIELD F), (s = STRIDE OR ARRAY ELEMENT SIZE)

| Type | Expression | Location Set |
|---|---|---|
| Int a | a | <0,0> |
| Struct {int F; } s | s.F | <F,0> |
| Int a[]; | a[i] | <0,s> |
| Struct{int F; } r[ ]; | r[i].F | <f,s> |
| Struct{int F[10];} r; | r.F[i] | <f mod s, s> |

Figure 3:
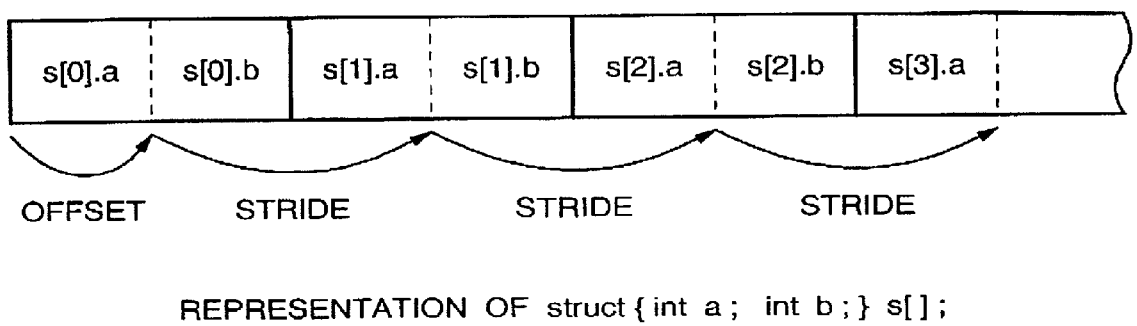
FIG. 3 is a diagram showing an example of representation for an array of structures.

FIG. 3 is a flow chart showing synthesis operation of the synthesizing system according to one embodiment of the present embodiment:

For simple data structures (arrays, structures, array of structures), offsets are used to identify the different fields of structures whereas strides are used to record array-element sizes. FIG. 3 gives an example of representation for an array of structures. The representation doesn't distinguish the different elements within the array but it distinguishes the different instantiations of variables and structures. This makes sense since all elements of an array are usually alike.

Nested arrays and structures, type casting and pointer arithmetic are making things more complicated, leading to some more inaccuracies. Example 2 shows how references to array nested in structures are represented approximately. The array bound information in the declared type cannot be used because the C language does not provide array-bounds checking. A reference to an array nested in a structure could access other elements of the structure by using out-of-bound array indices.

EXAMPLE 2

Consider the array r.F[ ] nested in a structure r: struct { char a;

char b;

int F[8];} r;

References to one of the array element (e.g. r.F[2]) are represented approximately by the locations set <0, sizeof (int)>which regroups all of the elements of the array as well as r.a.

Dynamically allocated memory locations (heap-allocated objects) are represented by a specific location set. As far as accuracy, the goal is to distinguish complete data structures. The different elements of a recursive data structure would typically be combined. For example, this inventors want to distinguish one list from another hut this inventors do not want to distinguish the different elements of a list. Heuristics are used to partition the heap. Storage allocated in the same context is assumed to be part of the same equivalence class. These heuristics have been proven to work well as long as the program uses the standard memory allocation routines (Robert Wilson, "Efficient, Context-Sensitive Pointer Analysis For C Programs", Ph.D. Dissertation, Stanford University, 1997.).

Definition of the Sunset

The pointer analyses and memory representation presented in "Memory representation" support the complete ANSI C syntax. In this description of the preferred embodiment however, this inventors define synthesizable subset. This subset includes malloc/free as well as all types of pointers and type casting. Nevertheless this inventors set the following two restrictions.

The first restriction applies to systems described as a set of parallel processes: pointers that reference data outside of the scope of a process (e.g. global variables or data internal to some other process) are not allowed. Their resolution would require the synthesis of some kind of interface between the processes. Such interface is usually defined during system partitioning and, hence, before synthesis. As a result, memory allocated in one process is assumed to be accessed and deallocated only within this same process.

The second limitation stems from the fact that most commercial synthesis tools also have restrictions on functions. Recursions are usually not supported. Procedures that are mapped to components typically have restrictions both on their functionality and their parameters. For example, the same function called within different contexts may usually not be shared. Besides, most synthesis tools do not synthesize parameter passed by reference, because this is not supported by most HDL syntax. The synthesis of functions in C, and therefore the resolution of pointers and malloc/free inside of functions, is beyond the scope of this description of the preferred embodiment.

Other restrictions are also added in the implementation section in order to be able to translate C models into Verilog synthesizable by commercial high-level synthesis tools. These restrictions are however not required for the resolution of pointers and dynamic memory allocation and do not apply for the next "SYNTHESIZING MALLOC AND FREE".

Synthesizing Malloc and Free

Resolution of pointers in complex data structures

This implementation uses a flow- and context-sensitive pointer analysis (Robert Wilson, "Efficient, Context-Sensitive Pointer Analysis For C Programs", Ph.D. Dissertation, Stanford University, 1997., Robert Wilson, Monica Lam, "Efficient Context-Sensitive Pointer Analysis for C Programs", proceedings of the ACM SIGPLAN'95 Conference on Programming Languages Design and Implementation, pp.1–12, June 95.) in which memory locations are represented by location sets. The points-to information is then used to encode the pointers' value and to generate the appropriate logic for accessing and deallocating data.

After encoding, the size of the pointers can be reduced as shown in (Luc Semeria, Giovanni De Micheli, "SpC: Synthesis of Pointers in C.Application of Pointer Analysis to the Behavioral Synthesis from C", proceedings of the International Conference on Computer-Aided Design ICCAD'98, pp.321–326, San Jose, November 98., Luc Semeria, Giovanni De Micheli, "Encoding of Pointers for Hardware Synthesis," proceedings of the International Work-shop on IP-based Synthesis and System Design IWLAS'98, pp. 57–63, Grenoble, December 98.). However, in order to support type casting and out-of-bound array accesses, this inventors assume that pointers have a fixed size. The size of a pointer itself is not defined by the ANSI standard. It is therefore implementation (or compiler in this case) dependent. In order to map pointers into hardware, the addresses (i.e. pointers' values) are encoded. Memory locations are represented by location sets.

Next, it explains using an example using two items, a tag and an index.

Definition 1.

The encoded value of a pointer p consists of two fields:

the tag p.tag (left part of the code) corresponds to the location set referenced by the pointer, the index p.index (right part of the code) stores the number of strides corresponding to the data referenced within the location set.

These fields don't have to be fields of a structure. They are a notation for "sections" of the code named tag and index.

Figure 4:
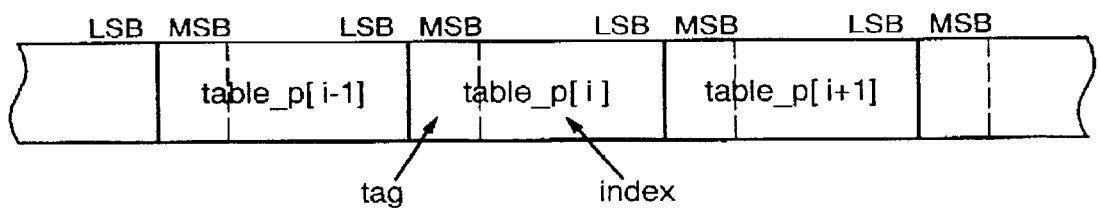
FIG. 4 is a diagram for explaining the encoding of pointers in array.

FIG. 4 is a diagram for explaining the encoding of pointers in array.

EXAMPLE 3

FIG. 4 gives an illustration of pointers' encoding inside of an array:

int *table_p[];

If the element table_p[i] were to point to s[2].b defined on FIG. 3, index table_p[i].index would be equal to 2.

The index part of the code is stored within the first bits (least significant bits) to support pointer arithmetic, especially when a pointer is type-cast into an integer. This encoding scheme has limitations on the number of location sets in the points-to set and on the number of elements addressable within each location set. For example, if this inventors allocate 8 bits for the tag and 8 bits for the index. The pointer can reference at most 256 location sets and the index can grave at most 256 values (e.g. from −127 to 128). These limitations should hardly be a problem in most designs.

EXAMPLE 4

Figure 5:
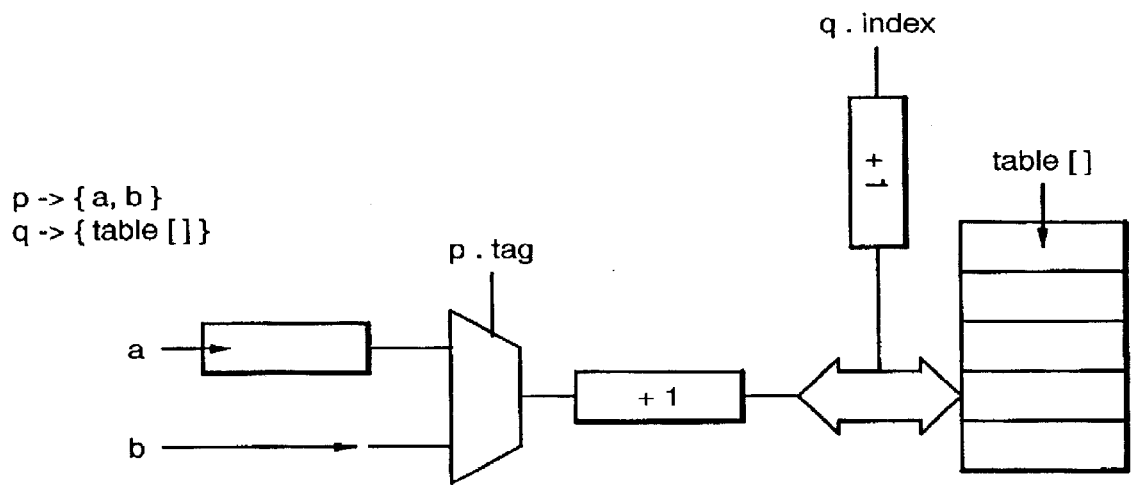
FIG. 5 is a diagram for explaining the implementation of *(q+1)=*p+1.

Consider the expression (*(q+1)=*p+1), in which pointer p points to variables a and b and pointer q points to an element of array table. The value of p is encoded. Its tag p.tag is defined as follows: the value 0 is associated with variable a and the value 1 is associated with variable b. Since pointer p doesn't point to any array element, its indexp.index is not used. On the other hand, pointer q points to a single location set which represents the elements of array table. Only q.index is being used. After removing the pointers, this inventors end up with the following code for *(q+1)=*p+1, where tmp_p and tmp_q are two temporary variables:

switch p.tag:
    case 0: tmp_p=a;
    case 1: tmp_p=b;
tmp_q=tmp_p+1;
table[q.index+1]=tmp_q;

An implementation for this code segment is shown in FIG. 5. The load is implemented using a 2-input multiplexer controlled by p.tag. Assuming the array table is mapped to a memory. The index q.index is used directly as the data address in memory.

FIG. 5 is a diagram for explaining the implementation of *(q+1)=*p+1.

This inventors have presented simple techniques to transform a C code with pointers into a code without pointers. The resolution of pointers can be further optimized. When the pointers' location set contains a single element (e.g. pointer variable), the number of live variables before loads and stores can be reduced (Luc Semeria, Giovanni De Micheli, "SpC: Synthesis of Pointers in C.Application of Pointer Analysis to the Behavioral Synthesis from C", proceedings of the International Conference on Computer-Aided Design ICCAD'98, pp.321–326, San Jose, November 98.). Heuristics can also be applied to encode the pointers' values (tag part) (Luc Seneria, Giovanni De Micheli, "Encoding of Pointers for Hardware Synthesis," proceedings of the International Work-shop on IP-based Synthesis and System Design IWLAS 98, pp. 57–63, Grenoble, December 98.).

Resolution of Malloc and Free

In order to support dynamic memory allocation and deallocation, the hardware needs to access an allocator. In general the allocator could be implemented in software (for mixed hardware/software implementations) or completely in hardware. Since this work is on the hardware synthesis of C code, only a hardware implementation is presented. Nevertheless, the techniques presented here could also be targeted to a software implementation.

In software, malloc and free are implemented as standard library functions. Similarly, for hardware synthesis, this inventors use a library of hardware components implementing malloc and free. The idea here is have one component, called allocator, implementing both the malloc and free functions as introduced in description of the related art. In order to efficiently manage memory, the memory space is partitioned into different memory segments in which data can be allocated.

Definition 2.

A memory segment is defined as an array of finite size in which data are allocated by unique allocator. This array may later on be mapped to one or more memories during synthesis.

In this tool, the partitioning of the memory into the different memory segments is done by the designer. Other tools could be used to assist this task at the system-level. For each malloc in the code, the designer selects in which memory segment the storage is allocated. Since the size of the dynamically allocated memory is a priori unknown at compile time, the designer also sets the size of each memory segment. The tool instantiates then the allocators corresponding to each memory segment and synthesizes the appropriate circuit to allocate, access and deallocate data.

For each memory segment, a different allocator is instantiated. Each malloc mapped to this memory segment is then replaced by a call to the specific allocator. The pointer that takes the result of the malloc function is defined as follows: its tag is set according to the corresponding memory segment and its index is set by the allocator. When multiple malloc calls are mapped to a single memory segment., the corresponding allocator is shared.

For a call free(p), the data to be deallocated may be in one memory segment or another depending on the value of the pointer p. This inventors generate a branching statement in which the different allocators corresponding the different memory segments may be called according to the pointer's tag. The pointer's index is then sent to the allocator to indicate which block should be deallocated. Loads, stores and addresses are resolved as shown in "Resolution of pointers in complex data structures". Examples 5 and 6 illustrate how malloc and free calls are resolved while removing pointers.

EXAMPLE 5

Consider the following code segment.
p=malloc(1);
out=*p;
free(p);

If malloc is mapped to a memory segment called seg1 of size 32 bytes, this inventors generate the following code (assuming that the size of char is one byte):

char seg1[32]; //memory segment: seg1
p.index=alloc_seg1(SPC_MALLOC,1);
out=seg1[p.index];
alloc_seg1(SPC_FREE,p.index);

The allocator component corresponding to the function alloc_seg1 is called for both malloc and free. It implements both the allocation and deallocation functions.

EXAMPLE 6

Figure 6:
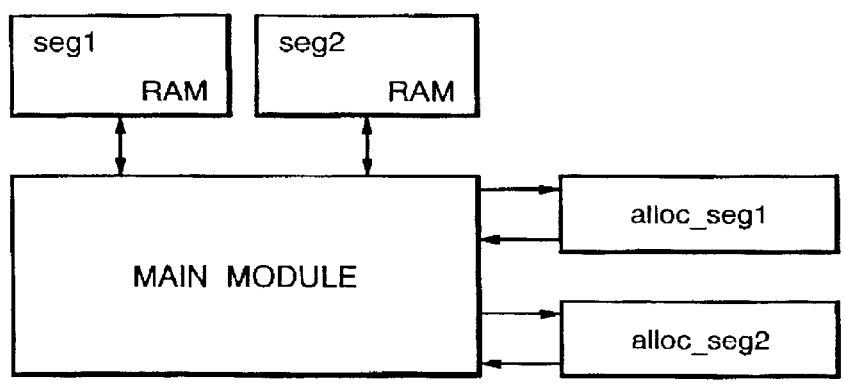
FIG. 6 is a diagram showing an example of architecture for multiple memory and allocator.

Now consider a more complex example where pointer p can point to different memory segments:

if(i==0)
    p=malloc(1); //malloc1
else
    p=malloc(4); //malloc2
out=*p;
free(p);

This inventors assume malloc1 is mapped to the memory segment seg1 and malloc2 is mapped to the memory segment seg2. Both memory segment are of size 32 bytes (set by the user). The resulting code, after removing malloc/free is the following:

if(i==0){
    p.tag=0;
    p.index=alloc_13 seg1(SPC_MALLOC,1);
}else{
    p.tag=1;
    p.index=alloc_seg2(SPC_MALLOC,4);
}
...
if(p.tag==0)
    out=seg1[p.index];
else
    out=seg2[p.index];
...
if(p.tag==0);
    alloc_seg1(SPC_FREE,p.index);
else
    alloc_seg2(SPC_FREE,p.index);

If each memory segment is mapped to a different RAM during synthesis, this inventors end up with the architecture on FIG. 6.

FIG. 6 is a diagram showing an example of architecture for multiple memory and allocator.

Figure 7:
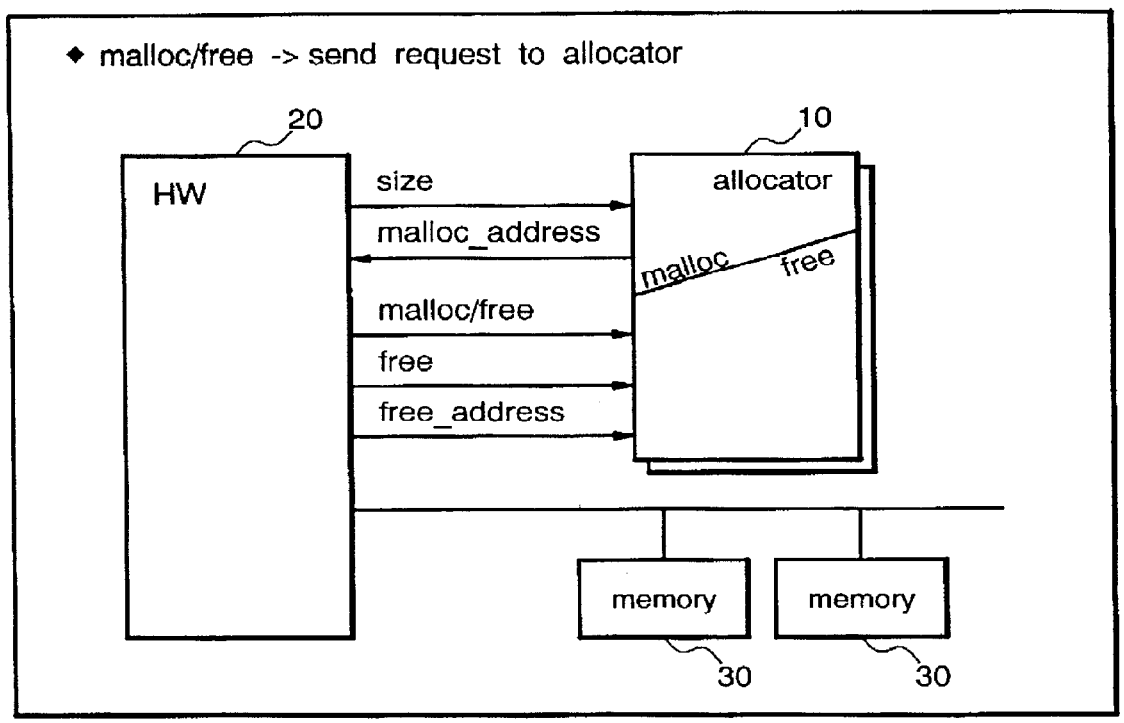
FIG. 7 is a diagram showing an example of allocator.

FIG. 7 is a diagram showing an example of allocator.

Allocators and Optimizations

This inventors present three optimizations. The first two optimizations aim at simplifying the allocator architecture. The goal for the last optimization is to automatically remove some of the dynamic memory allocation/deallocation for sequences of malloc and free.

This library of allocator components contains three main types of allocators synthesized directly from C using SpC. the notion a hardware allocator, which implements both the malloc and free functions, was introduced. This inventors define as general purpose an allocator that can allocate blocks of any size. In "Optimized general purpose allocator" this inventors present an optimized general purpose allocator, for which the deallocation scheme is optimized. When the size of the block to be allocated is a fixed constant, the architecture of the allocator can be greatly simplified. The specific purpose allocator presented in "Specific purpose allocator" can be used in such case.

Different implementations of these allocators can be generated by changing the allocation and deallocation schemes as well as the data structures internal to the allocator (Sven Wuytack, Julio da Silva Jr., Francky catthoor, Gjalt de Jong, Chantal Ykman, "Memory Management for Embedded Network Applications," transactions on Computer Aided Design, Volume 18, number 5, pp. 533–544, May 99.). They can be added to this framework as new components in the library. The designer or the tool would select which allocator fits the application best.

Optimized General Purpose Allocator

When a block is freed using the free function call, the address of the beginning of the block is passed as an argument. The allocator then searches for the exact block characteristics (e g. size) in the list of allocated blocks before adding it back to the list of free blocks.

In order to simplify the process of looking up for a given block during deallocation, this inventors propose to encode the characteristics of the allocated block inside of the pointer's tag. In this implementation, the allocator stores the list of allocated blocks in an array. The index corresponding to an allocated block in this array is then encoded inside of the tag. During deallocation, the allocator can then directly find the allocated block according to this index, without having to search the entire array. The resulting optimized allocator is called optimized general purpose.

Specific Purpose allocator

The malloc function takes one argument: the size of the block to be allocated. When this size is a unique constant K for all of the malloc mapped a single memory segment, this memory segment can then be represented as an array of elements of size K. Allocating memory in this segment can simply be performed by returning the first available element in the array. For deallocation, the address of the block to deallocate can easily be derived from its address. The architecture of the corresponding allocator can then be simplified. For example a simple bit-vector can be used to keep track of the allocated and free blocks in the memory segment. Such an allocator, which can only deal with blocks of one size, is called specific purpose.

Constant propagation can be performed before selecting the allocator in order to have as many malloc as possible with constant size.

Removing Sequences of Malloc and Free Calls

Some of the dynamic memory allocations are sometimes not necessary and can be removed at compile-time. This is especially true for legacy code in which malloc/free are used to manually control storage. The idea here is to isolate the finite sequences of malloc calls which can be replaced by references to statically allocated data.

EXAMPLE 7

Consider the following code segment.

p[1]=malloc(4); //malloc1
p[2]=malloc(8); /malloc2
. . .
free(p[1]); //free1
free(p[2]); //free2

In this example, a finite number of objects (two) are allocated by malloc1 and malloc2. Later on, these blocks are freed by free1 and free2. The dynamic memory allocation in this case can be optimized by creating the two temporary array elements tmp_malloc1[4] and tmp_malloc2[8]. The size of these elements corresponds to the size of the object allocated at each malloc. The malloc calls are then replaced by references to these temporary variables arid the free calls are removed. This inventors end up with the following code segment in which memory is statically allocated.

char tmp_malloc1[4];
char tmp_malloc2[8];
p[1]=tmp_malloc1; //malloc(4)
p[2]=tmp_malloc2; //malloc(8)
. . .
//free(p[1]);
//free(p[2]);

This optimization can be performed under two conditions. First, the size of the data to be allocated has to be constant. If the size of the data to be allocated is not known at compile-time, a general purpose allocator would have to be used. Second, dynamically-allocated data have to be both allocated and deallocated within the same unbounded loop (e.g. cannot optimize malloc in a while loop). Using the results of the pointer analysis, this inventors have implemented a dataflow analysis which finds at compile time the malloc and free calls that can be optimized (i.e. removed).

The idea is to have a counter for each dynamically-allocated location set. During the analysis, the counter is incremented each time an element of the corresponding location set is allocated. Subsequently, each time an element of the location set is deallocated (result from the pointer analysis), the associated counter is decremented. This way, location sets allocated and not deallocated within these locations cannot be optimized. Otherwise, they can be optimized.

During optimization a temporary variable is created for each malloc which can be removed. The size of the temporary variables corresponds to the size in the malloc call. These temporary variables are then statically allocated during synthesis. The corresponding free calls are removed.

Another sequence optimization as the second example is provided in this tool. The above sequence optimization considers the constant size of the dynamic allocated area. Another can deal with the variable size.

p=malloc(x); // assigned to RAM1
. . .
q=malloc(y); // assigned to RAM2
. . .
free(p);

p is allocated with the size x on RAM1 and q is allocated with the size y on RAM2.

Finally, p is freed. Focusing on the same kind of the memory segment, p=malloc(x) is followed by free(p). The condition inside the allocator before p=malloc(x) is the same as just after free(p). It turns out that changing the free-list at the allocation and merging the free area at the deallocation are not necessary.

Therefore, another mode of the allocation is provided. In this mode the free area is only searched and free() can be removed. The performance of the circuit can be improved thereby. In the case of the above example, the following code can be generated.

p=alloc_seg1(SPC_MALLOC2, x); // assigned to RAM1
. . .
q=alloc_seg2(SPC_MALLOC1, y); // assigned to RAM2
. . .
// free(p); this can be removed.

SPC_MALLOC1 is the regular allocation and SPC_MALLOC2 is the above new allocation.

Implementation and Results

Tool flow

In "SYNTHESIZING MALLOC AND FREE", this inventors have shown how pointers and malloc/free can be resolved at compile-time. It is the first step for the synthesis of C code involving pointers and dynamically allocated memory.

This inventors present an implementation based on today's commercial synthesis tools. This inventors are not trying to solve the problem of efficiently synthesizing all of the ANSI C syntax at once here. As a result, the examples used here do not contain type casting and structures which are hard to translate into efficient synthesizable HDL code.

This inventors have implemented the different techniques presented here using the SUIF environment (R. P. Wilson et al. "SUIF: An Infrastructure for Research on Parallelizing and Optimizing Compilers", ACM SIPLAN Notices 28(9), pp.67–70, Sept.1994.). The toolflow is shown on FIG. 8. This implementation takes a C function with pointers and malloc/free and generates a Verilog module. This module can then be synthesized using the Behavioral Compiler of Synopsys.

In addition to the C input function, the designer defines a set of memory segments as well as the mapping of each malloc call to one of these memory segments. The malloc/free calls that are not removed by the optimization are then replaced by calls to the custom allocator function (specific, general purpose or optimized general purpose). Pointers are then removed and the code gets translated into Verilog. Each type of allocator is defined as an hardware component in a library. During the translation into HDL, the different allocators corresponding to each memory segment are instantiated and the custom allocator functions are mapped to these allocator modules. The communication between each allocator and the main module is done using hand-shakes. The resulting HDL code can then be synthesized using traditional high-level synthesis tools.

Figure 8:
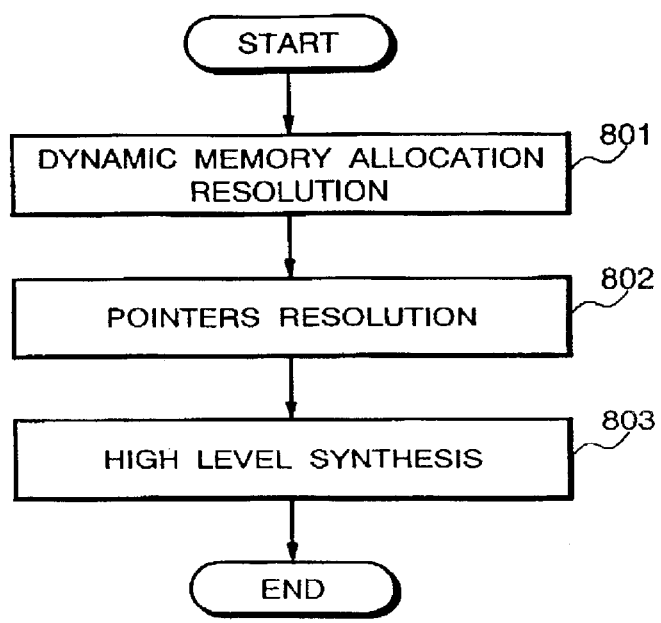
FIG. 8 is a flow chart showing resolution of dynamic memory allocation and pointers for hardware synthesis from C.
Figure 10:
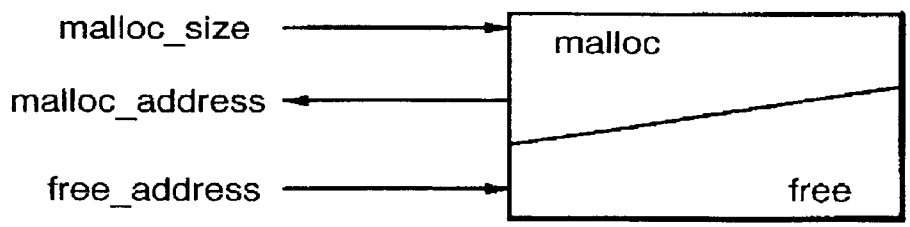
FIG. 10 is a diagram for explaining the interface of the allocator block implementing malloc and free functions.

FIG. 8 is a flow chart showing resolution of dynamic memory allocation and pointers for hardware synthesis from C.

Experimental Results and Discussion

For the set of examples presented here, this inventors have synthesized three types of allocators in this library. In the results presented in Table 2, allocators are designed to allocate up to 16 blocks of memory. They are synthesized directly from C using SpC and Synopsys Behavioral Compiler. The general purpose allocators use first-fit to allocate blocks and merge adjacent free blocks during deallocation. The first row presents the results for the general purpose allocator without any optimization. The second row shows the size of the optimized general purpose allocator for which the deallocation scheme has been optimized using the modified tag as presented in "Optimized general purpose allocator". Even though the complexity of controller is reduced (from 52 states to 46), the size of the optimized allocator is roughly the same because of an increase in the steering logic The latency of the deallocation task will however be reduced as this inventors see in the examples below. Finally the third row presents the results for the specific purpose allocator introduced in "Specific purpose allocator". As expected its size is much smaller than the general purpose allocators.

TABLE 2

IMPLEMENTATION OF THE DIFFERENT ALLOCATORS (AREA IN LIBRARY UNITS USING THE TSMC.35 TARGET LIBRARY; comb. AND non-comb. REPRESENT RESPECTIVELY THE AREA OF COMBINATIONAL LOGIC AND NON-COMBINATIONAL LOGIC (i.e. REGISTERS, etc.) AT 100 MHz)

|  | lines | | size | |
| --- | --- | --- | --- | --- |
| allocator | C | HDL | comb. | noncomb |
| general purpose | 297 | 353 | 204,191 | 80,193 |
| general purpose (opt) | 289 | 349 | 212,065 | 81,652 |
| specific purpose | 85 | 135 | 33,579 | 19,830 |

Table 3 shows the results for three different examples. The first two examples test1 and test2 consists of three malloc calls and two free calls. All malloc calls allocate objects of the same constant size. Hence a specific purpose allocator can be used. For the first example, all calls malloc and free can be removed during optimizations. For the second example, one of the mallocs is called inside of a unbounded loop and cannot be removed. The third example is a filter used in the JPEG library of Synopsys COSSAP and is used, for example, for RGB to YCrCb transformations. The filter implements the operation Y[i]=clip(A·X[i]+B,C) for i={1,2, . . . , n}, where A is a 3*3 matrix, B and C are vectors and Y and X are 3*n dynamically-allocated matrix.

For each example, the first set of results illustrates the case where malloc calls are mapped to two general-purpose allocators (no sharing). For the other results, one allocator is shared. As expected, the latency (measured by simulation at the RTL level) increases without sharing with a decrease in area. In the table, this inventors can also verify that the total latency of the design decreases when the optimized general purpose allocator (gen. alloc. optimized) is used. The use of a specific purpose allocator (spec. alloc.)when possible provides significant reduction both in latency and area. Finally, further optimizations can be performed when sequences of malloc and free calls can be removed (sequence).

Conclusion

This inventors have presented an extension of the synthesizable C subset to pointers and malloc/free. Moreover, this extension is realizable similarly to other a program with a function of pointers and dynamic allocation/deallocation, C++, Java. The resolution of dynamic memory allocation/deallocation and pointers enables the implementation of complex data structures into hardware. This solution fits into current application specific memory management methodology. In order to efficiently partition the storage among the different data structures during analysis and synthesis, memory is represented by location sets. Dynamic memory allocation and deallocation are performed within each user-defined memory segments by an optimized hardware allocator.

This tool SpC takes a C function with pointers and malloc/free and generates a Verilog module which can be synthesized by commercial tools. This inventors provide a library of hardware allocators. The different allocators are selected and optimized according to the application and the memory architecture.

According to another aspect of the invention, a computer readable memory that records a circuit synthesizing program for synthesizing a circuit of executing a C-language program, wherein the circuit synthesizing program causes the computer to carry out the processes of pointer analysis and Resolution of pointer and malloc/free Optimizations and Removing sequences of malloc and free calls.

Although the invention has been illustrated and described with respect to exemplary embodiment thereof, it should be understood by those skilled in the art that the foregoing and various other changes, omissions and additions may be made therein and thereto, without departing from the spirit and scope of the present invention.

What is claimed is:

1. A circuit synthesis method of a semiconductor circuit for executing a program with a function of pointers and dynamic allocation, comprising:

resolving pointer and dynamic allocation in a code of the program; and changing the code of the program into another code which does not contain said pointer and said dynamic allocation;

wherein the semiconductor circuit executes the program with a function of pointers and dynamic allocation when a synthesis of said semiconductor circuit is performed.

2. The circuit synthesis method as set forth in claim 1, wherein, said program is C-language program.

3. The circuit synthesis method as set forth in claim 1, further comprising:

changing said another code into a code of Hardware Description Languages, and synthesizing said semiconductor circuit based on said code of Hardware Description Languages.

4. The circuit synthesis method as set forth in claim 1, said resolving step including:

checking the kind of the variable which is the object of dynamic allocation and the quantity of a memory assigned in the code, performing beforehand variable declaration of the variable which is the object of the dynamic allocation statically in the converted code, replacing a command which performs dynamic allocation in the code with a command which gives the pointer to the variable by which variable declaration was carried out.

5. A circuit synthesis method of a semiconductor circuit for executing a program with a function of pointers and dynamic allocation, comprising:

resolving pointer and dynamic allocation in a code of the program; and changing the code of the program into another code which does not contain said pointer and said dynamic allocation; and said resolving step including checking the kind of the variable which is the object of dynamic allocation and the quantity of a memory assigned in the code, performing beforehand variable declaration of the variable which is the object of the dynamic allocation statically in the converted code, replacing a command which performs dynamic allocation in the code with a command which gives the pointer to the variable by which variable declaration was carried out, wherein the semiconductor circuit executes the program with a function of pointers and dynamic allocation when a'synthesis of said semiconductor circuit is performed.

6. A circuit synthesis method of a semiconductor circuit for executing a program with a function of pointers and dynamic allocation, comprising:

resolving pointer and dynamic allocation in a code of the program; and changing the code of the program into another code which does not contain said pointer and said dynamic allocation; and said resolution step including a pointer analysis step of finding a pointer variable in the code, and checking information on a variable which substitutes an address to each pointer variable, executing variable declaration of a structure object comprising a variable tag and a integer variable index in the code after conversion corresponding to each pointer variable, wherein a variable tag shows the kind of variable substituted to a pointer variable, and an integer variable index records addition-and-subtraction processing in the code to the pointer variable, replacing a command which substitutes the address of other variables to said pointer variable in said code with a command which substitutes information on the kind of other variables to the variable tag and substitutes value "0" to the variable index, replacing a command which fluctuates the value of the pointer variable in the code with a command which fluctuates the value of the variable index of the structure object corresponding to the pointer variable, replacing a command which refers to the address shown by the pointer variable with a command which refers to the value of the arrangement position of the value of the variable index in the variable shown by the variable tag, checking the kind of the variable which is the object of dynamic allocation and the quantity of a memory assigned in the code, performing beforehand variable declaration of the variable which is the object of the dynamic allocation statically in the converted code, replacing the command which performs dynamic allocation in the code with the command which gives the pointer to the variable by which variable declaration was carried out, wherein the semiconductor circuit executes the program with a function of pointers and dynamic allocation when a synthesis of said semiconductor circuit is performed.

7. The circuit synthesis method as set forth in claim 6, further comprising recording a number of a block allocated to block of the pointer variable, accessing the block by specifying the number in free area by an allocator, wherein synthesizing the semiconductor circuit executes management of an optimized free area.

8. The circuit synthesis method as set forth in claim 6, said resolution step including when the size of the variable to be allocated has to be constant, and dynamically-allocated variable have to be both allocated and deallocated within the same unbounded loop, performing beforehand statically variable declaration of the array variable which is the same size as the dynamically-allocated variable in the converted code, replacing a command which performs dynamic allocation with a command which references the variable to the array variable by which variable declaration was carried out, and removing the command that performs dynamic deallocation in the code.

9. A circuit synthesis system of a semiconductor circuit for executing a program with a function of pointers and dynamic allocation, comprising:

a means for resolving pointer and dynamic allocation in a code of the program; and a means for changing the code of the program into another code which does not contain said pointer and said dynamic allocation;

wherein the semiconductor circuit executes the program with a function of pointers and dynamic allocation when a synthesis of said semiconductor circuit is performed.

10. The circuit synthesis system as set forth in claim 9, wherein, said program is C-language program.

11. The circuit synthesis system as set forth in claim 9, further comprising a means for changing said another code into a code of Hardware Description Languages, and a means for synthesizing said semiconductor circuit based on said code of Hardware Description Languages.

12. The circuit synthesis system as set forth in claim 9, said resolution meaning including a means for checking the kind of the variable which is the object of dynamic allocation and the quantity of a memory assigned in the code, a mean s for performing beforehand variable declaration of the variable which is the object of the dynamic allocation statically in the converted code, and a means for replacing a command which performs dynamic allocation in the code with a command which gives the pointer to the variable by which variable declaration was carried out.

13. A circuit synthesis system of a semiconductor circuit for executing a program with a function of pointers and dynamic allocation, comprising:
   a means for resolving pointer and dynamic allocation in a code of the program; and
   a means for changing the code of the program into another code which does not contain said pointer and said dynamic allocation; and said resolution meaning including
      a means for checking the kind of the variable which is the object of dynamic allocation and the quantity of a memory assigned in the code
      a means for performing beforehand variable declaration of the variable which is the object of the dynamic allocation statically in the converted code,
      a means for replacing a command which performs dynamic allocation in the code with a command which gives the pointer to the variable by which variable declaration was carried out,
   wherein the semiconductor circuit executes the program with a function of pointers and dynamic allocation when a synthesis of said semiconductor circuit is performed.

14. A circuit synthesis system of a semiconductor circuit for executing a program with a function of pointers and dynamic allocation, comprising:
   a means for resolving pointer and dynamic allocation in a code of the program; and
   a means for changing the code of the program into another code which does not contain said pointer and said dynamic allocation; and
   said resolution meaning including a pointer analysis means for finding pointer variable in the code, and checking information on the variable which substitutes an address to each pointer variable,
   a means for executing variable declaration of a structure object comprising a variable tag and a integer variable index in the code after the conversion corresponding to each pointer variable, wherein the variable tag shows the kind of variable substituted to a pointer variable, and which integer variable index records the addition-and-subtraction processing in the code to the pointer variable,
   a means for replacing a command which substitutes'the address of other variables to said pointer variable in said code with a command which substitutes information on the kind of other variables to the variable tag and substitutes value "0" to the variable index,
   a means for replacing a command which fluctuates the value of the pointer variable in the code with a command which fluctuates the value of the variable index of the structure object corresponding to the pointer variable,
   a means for replacing a command which refers to the address shown by the pointer variable with a command which refers to the value of the arrangement position of the value of the variable index in the variable shown by the variable tag,
   a means for checking the kind of the variable which is the object of dynamic allocation and the quantity of a memory assigned in the code,
   a means for performing beforehand variable declaration of the variable which is the object of the dynamic allocation statically in the converted code,
   a means for replacing a command which performs dynamic allocation in the code with a command which gives the pointer to the variable by which variable declaration was carried out,
   wherein the semiconductor circuit executes the program with a function of pointers and dynamic allocation when a synthesis of said semiconductor circuit is performed.

15. The circuit synthesis system as set forth in claim 14, further comprising
   a means for recording a number of a block allocated to block of the pointer variable,
   a means for accessing'the block by specifying the number of the block in free area by an allocator,
   wherein synthesizing the semiconductor circuit executes management of optimized free area.

16. The circuit synthesis system as set forth in claim 14, said resolution meaning including
   when the size of the variable to be allocated has to be constant, and dynamically-allocated variable have to be both allocated and deallocated within the same unbounded loop,
   a means for performing beforehand statically variable declaration of the array variable which is the same size as the dynamically-allocated variable in the converted code,
   a means for replacing a command which performs dynamic allocation with a command which references the variable to the array variable by which variable declaration was carried out, and
   a means for removing the command that performs dynamic deallocation in the code.

17. A computer readable memory recording a circuit synthesizing program for a circuit synthesizing of a semiconductor circuit for executing a program with a function of pointers and dynamic allocation, said circuit synthesizing program comprising the steps of:
   resolving pointer and dynamic allocation in a code of the program; and
   changing the code of the program into another code which does not contain said pointer and said dynamic allocation;
   wherein the semiconductor circuit executes the program with a function of pointers and dynamic allocation when a synthesis of said semiconductor circuit is performed.

18. The computer readable memory recording a circuit synthesizing program for a circuit synthesizing of as set forth in claim 17, wherein
   said program is C-language program.

19. The computer readable memory recording a circuit synthesizing program for a circuit synthesizing of as set forth in claim 17, said circuit synthesizing program further comprising:
   changing said code changed by said resolution step into a code of Hardware Description Languages, and
   synthesizing said semiconductor circuit based on said code of Hardware Description Languages.

20. The computer readable memory recording a circuit synthesizing program for a circuit synthesizing of as set forth in claim 17,
   said resolution step of said circuit synthesizing program including checking the kind of the variable which is the object of dynamic allocation and the quantity of a memory assigned in the code, performing beforehand variable declaration of the variable which is the object of the dynamic allocation statically in the converted code, and replacing a command which performs dynamic allocation in the code with a command which gives the pointer to the variable by which variable declaration was carried out.

21. A computer readable memory recording a circuit synthesizing program for a circuit synthesizing of a semiconductor circuit for executing a program with a function of pointers and dynamic allocation, said circuit synthesizing program comprising the steps of:

resolving pointer and dynamic allocation in a code of the program; and changing the code of the program into another code which does not contain said pointer and said dynamic allocation; and said resolution step including checking the kind of the variable which is the object of dynamic allocation and the quantity of a memory assigned in the code, performing beforehand variable declaration of the variable which is the object of the dynamic allocation statically in the converted code, replacing a command which performs dynamic allocation in the code with a command which gives the pointer to the variable by which variable declaration was carried out, wherein the semiconductor circuit executes the program with a function of pointers and dynamic allocation when a synthesis of said semiconductor circuit is performed.

22. A computer readable memory recording a circuit synthesizing program for a circuit synthesizing of a semiconductor circuit for executing a program with a function of pointers and dynamic allocation, said circuit synthesizing program comprising the steps of:

resolving pointer and dynamic allocation in a code of the program; and changing the code of the program into another code which does not contain said pointer and said dynamic allocation; and said resolution step of said circuit synthesizing program including a pointer analysis step of finding a pointer variable in the code, and checking information on the a variable which substitutes an address to each pointer variable, executing variable declaration of a structure object comprising a variable tag and a integer variable index in the code after the conversion corresponding to each pointer variable, which variable tag shows the kind of variable substituted to a pointer variable, and which integer variable index records the addition—and—subtraction processing in the code to the pointer variable, replacing a command which substitutes the address of other variables to said pointer variable in said code with a command which substitutes information on the kind of other variables to the variable tag and substitutes value "0" to the variable index, replacing a command which fluctuates the value of the pointer variable in the code with a command which fluctuates the value of the variable index of the structure object corresponding to the pointer variable, replacing a command which refers to the address shown by the pointer variable with a command which refers to the value of the arrangement position of the value of the variable index in the variable shown by the variable tag, checking the kind of the variable which is the object of dynamic allocation and the quantity of a memory assigned in the code, performing beforehand variable declaration of the variable which is the object of the dynamic allocation statically in the converted code, replacing a command which performs dynamic allocation in the code with a command which gives the pointer to the variable by which variable declaration was carried out, wherein the semiconductor circuit executes the program with a function of pointers and dynamic allocation when a synthesis of said semiconductor circuit is performed.

23. The computer readable memory recording a circuit synthesizing program for a circuit synthesizing of as set forth in claim 22, said circuit synthesizing program further comprising:

recording the number of block allocated to block of the pointer variable, and accessing the block by specifying the number of block in free area by an allocator, wherein synthesizing the semiconductor circuit executes management of optimized free area.

24. The computer readable memory recording a circuit synthesizing program for a circuit synthesizing of as set forth in claim 22, said resolution step including when a size of the variable to be allocated is constant, and dynamically-allocated variable is both allocated and deallocated within the same unbounded loop, performing beforehand statically variable declaration of the array variable which is the same size as the dynamically-allocated variable in the converted code, replacing a command which performs dynamic allocation with the command which references the variable to the array variable by which variable declaration was carried out, and removing the command performs dynamic deallocation in the code.

* * * * *